United States Patent
Sameshima

(10) Patent No.: US 6,339,010 B2
(45) Date of Patent: Jan. 15, 2002

(54) SEMICONDUCTOR ELEMENT FORMING PROCESS HAVING A STEP OF SEPARATING FILM STRUCTURE FROM SUBSTRATE

(75) Inventor: Toshiyuki Sameshima, Kokubunji (JP)

(73) Assignee: President of Tokyo University of Agriculture & Technology, Tokyo (JP)

( * ) Notice: Subject to any disclaimer, the term of this patent is extended or adjusted under 35 U.S.C. 154(b) by 0 days.

(21) Appl. No.: 09/152,338

(22) Filed: Sep. 14, 1998

(30) Foreign Application Priority Data

Sep. 16, 1997 (JP) .............................. 9-250952

(51) Int. Cl.[7] .............................................. H01L 21/30
(52) U.S. Cl. ...................... 438/458; 438/462; 438/464; 438/465; 438/459; 438/977
(58) Field of Search ................................ 438/458, 464, 438/406, 977, 460, 462, 465, 455, 459, DIG. 135, DIG. 148

(56) References Cited

U.S. PATENT DOCUMENTS

| | | | |
|---|---|---|---|
| 5,071,792 A | * 12/1991 | VanVonno et al. | 438/977 |
| 5,073,230 A | * 12/1991 | Maracas et al. | 438/977 |
| 5,272,104 A | * 12/1993 | Schrantz et al. | 437/63 |
| 5,391,257 A | * 2/1995 | Sullivan et al. | 438/977 |
| 5,418,007 A | 5/1995 | Debe | |
| 5,480,503 A | * 1/1996 | Casey et al. | 156/272.2 |
| 5,654,811 A | * 8/1997 | Spitzler et al. | 349/106 |
| 5,665,607 A | * 9/1997 | Kawama et al. | 438/977 |
| 5,811,348 A | * 9/1998 | Matsushita et al. | 438/458 |
| 5,821,138 A | * 10/1998 | Yamazaki et al. | 438/977 |
| 5,827,751 A | * 10/1998 | Nuyen | 438/464 |

FOREIGN PATENT DOCUMENTS

| | | | |
|---|---|---|---|
| JP | 59-127860 | 7/1984 | |
| JP | 40 1089330 | * 4/1989 | ................. 438/458 |
| JP | 401227441 | * 9/1989 | ................. 438/458 |
| JP | 5-136171 | 6/1993 | |
| JP | 5-283722 | 10/1993 | |
| JP | 5-315255 | 11/1993 | |
| JP | 7-221113 | 8/1995 | |
| JP | 7-226528 | 8/1995 | |

* cited by examiner

Primary Examiner—Olik Chaudhuri
Assistant Examiner—Wai-Sing Louie
(74) Attorney, Agent, or Firm—Oblon, Spivak, McClelland, Maier & Neustadt, P.C.

(57) ABSTRACT

The invention provides a process of forming a semiconductor device, including the steps of: forming a separation member, used to form a separation layer, on a flat surface of a support substrate; forming support sections on the flat surface by removing portions of the separation member; forming, above the support sections, a film structure having a single layer or a plurality of layers; and separating the film structure from the Support substrate by removing the separation layer. The invention also provides a process of transferring a film structure having a single layer or a plurality of layers, including the steps of: forming a separation member used to form a separation layer on a flat surface of a first substrate; forming support sections on the flat surface by removing part of the separation member; forming, on the support sections, a film structure having a single layer or a plurality of layers; adhering a second substrate to the film structure; and separating the first substrate from the film structure by removing the separation layer.

8 Claims, 6 Drawing Sheets

SEMICONDUCTOR ELEMENT FORMING PROCESS HAVING A STEP OF SEPARATING FILM STRUCTURE FROM SUBSTRATE

BACKGROUND OF THE INVENTION

This invention relates to a process of manufacturing a semiconductor device, and more particularly to a process of manufacturing a semiconductor element or circuit using a transfer technique.

Bipolar transistors and MOS transistors formed on monocrystalline silicon surfaces show excellent electric characteristics and hence are used to constitute various types of electronic devices. Further, an SOI technique for forming a transistor on a thin silicon film, which film is formed on a silicon substrate with an insulating film interposed therebetween, has recently been developed to meet, for example, a demand for reduction of element size. In this technique, thermal oxidation, thermal diffusion, etc. are employed to form semiconductor elements. These heat treatments are usually performed at about 1000° C.

On the other hand, semiconductor layers have come to be formed at a relatively low temperature by plasma CVD, laser crystallization, etc., on which layers are formed polycrystalline silicon thin film transistors or amorphous silicon thin film transistors.

At the present stage, there is a demand for application of the thin film transistors to a driving circuit incorporated in a wide-screen direct viewing display. To meet this demand, it is necessary to establish a big-scale substrate treatment technique.

The aforementioned process technique for forming silicon transistors is based on a heat treatment technique using a high temperature of about 1000° C.

Therefore, a transistor of excellent electric characteristics, for example, cannot be formed on a semiconductor thin film provided on a substrate of a low heat resistance.

Although reduction of the process temperature has been realized by new techniques such as plasma CVD, laser crystallization, etc., it is still necessary, even in the case of using the new techniques, to set the process temperature at 300° C. or more in order to form an element of excellent electric characteristics. Thus, it is difficult to directly form a transistor circuit on a non-heat-resistive substrate formed of, for example, plastic. In addition, in the case of directly forming transistor circuits on a large scale substrate, a large process apparatus is necessary, the precision of the process apparatus may well degrade, and produced transistor circuits will be expensive.

BRIEF SUMMARY OF THE INVENTION

The present invention has been developed to solve the above problems, and is aimed at providing a process of forming a transistor circuit of excellent properties on a substrate of a low heat resistance, and realizing a large scale device.

The aim can be attained by the step of separating a film structure which consists of a single layer or plural layers and is necessary to form a transistor circuit, from a substrate which supports the film structure. If necessary, the film structure is adhered to another substrate of a low heat resistance. To this end, the invention employs a separation layer interposed between the film structure and the substrate supporting it.

In the process, according to the invention, of forming the film structure which consists of the single layer or plural layers and is necessary to form the transistor circuit, a separation layer is interposed beforehand between the substrate and the film structure.

After a transistor circuit, for example, is formed in the film structure by a high temperature treatment, the separation layer is removed by etching to separate the film structure from the support substrate.

In this case, the removal of the separation layer is more facilitated by forming air gaps in at least a portion of the layer.

In addition, in the invention, the step of separating the film structure from the support substrate by removing the separation layer can be performed during or after the formation of a desired semiconductor device in the film structure.

The semiconductor device circuit produced by the process of the invention is, for example, a circuit which consists of one or more thin film transistors, one or more MOSFETs, or one or more bipolar transistors, a circuit using a solar battery, or an integrated circuit consisting of a plurality of such active elements. It is a matter of course that the semiconductor device circuit is not limited to the above.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiments of the invention will be described with reference to the accompanying drawings.

Figure 1A:
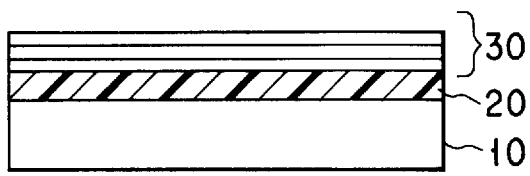
FIGS. 1A–1C are views, useful in explaining the basic idea of the invention that a film structure consisting of a single or plural layers is separated from a substrate.
Figure 1B:
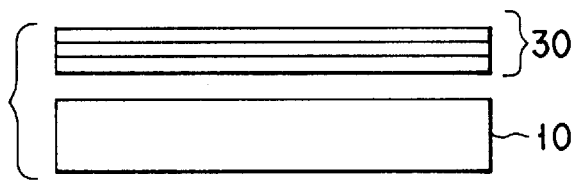
Figure 1C:
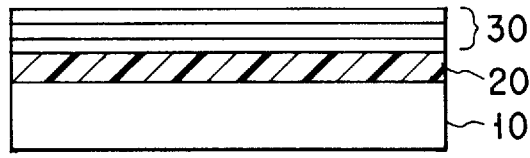

FIGS. 1A–1C illustrate the basic idea of the invention. As shown in these figures, a separation layer 20 is formed on a substrate 10 made of a semiconductor material such as silicon, silicon nitride, quartz or ceramic, or of a heat resistive insulating material. Then, a film structure 30 is formed on the separation layer 20. The film structure 30 consists of a single or plural layers which include a semiconductor layer necessary for forming a predetermined circuit and made of silicon, or a II–VI group or III–V group compound semiconductor.

Preferably, the separation layer is made of a material which is stable at a heat treatment temperature for forming a semiconductor element in the semiconductor layer, desirably at 1000–1100° c., and which will not adversely affect the semiconductor layer or the semiconductor element formed therein even at that temperature. Specifically, the separation layer is made of a metallic material such as chrome, nickel, tantalum, tungsten, etc. or of an insulating material such as alumina, silicon nitride, silicon dioxide, etc. or of InZnO.

It is necessary to set the thickness of the separation layer at least 200 nm or more in light of etching of the separation layer performed layer. In view of the necessity to reduce the thermal strain between the substrate material 10 and the film structure material 30, or of the time necessary to form the separation layer, the thickness of the separation layer is desirably set at 20000 nm or less, and more desirable at about 1000–10000 nm. The separation layer is formed by vacuum deposition employed in a usual semiconductor manufacturing process, vapor phase epitaxy, sputtering, etc.

After that, a semiconductor element such as a solar battery, a diode, a transistor, etc. is formed in the semiconductor layer of the film structure 30 in a predetermined semiconductor treatment step such as a usual diffusion step or an ion implant step. Instead of the single semiconductor element, plural semiconductor elements connected to each other by metal wires may be formed as an integrated circuit. At this stage, the step of forming the semiconductor element is not necessarily completed, but at least a high temperature treatment must be finished.

Thereafter, the separation layer is removed by, for example, etching as shown in FIG. 1B, to thereby separate from the substrate 10 the film structure 30 consisting of a single or plural layers. The separation layer is etched using an etching solution containing phosphoric acid as a main component when the separation layer is made of alumina, silicon nitride, etc., using an etching solution containing fluoric acid when it is made of silicon dioxide, and using hydrochloric acid when it is made of InZnO.

If the film structure 30 consisting of a single or plural layers has a sufficient mechanical strength and does not need any other physical support, it can be used, after separation, as a separate semiconductor element or a circuit device including semiconductor elements.

On the other hand, if the film structure 30 is separated during the process step, a process step of forming a semiconductor element, a circuit device using the semiconductor element, or metallic wiring is carried out immediately after the first-mentioned step.

Moreover, the substrate 10 obtained after the separation of the film structure 30 can be used again as a support substrate by forming thereon a single or plural layers necessary for forming a semiconductor element or circuit, as is shown in FIG. 1C.

Figure 2A:
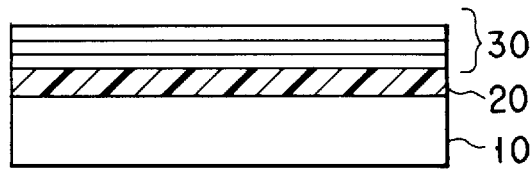
FIGS. 2A–2C are views, useful in explaining a case where when a film structure consisting of a single or plural layers is separated from a substrate, another substrate for supporting the film structure is used.
Figure 2B:
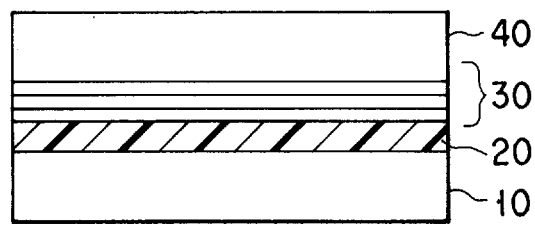
Figure 2C:
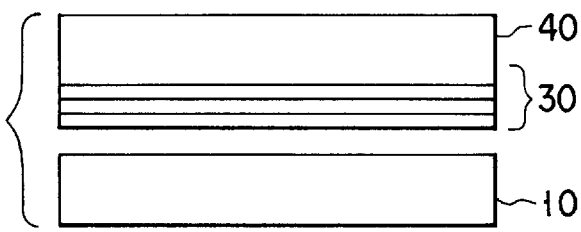

FIGS. 2A–2C show another embodiment using a support substrate 40 which differs from the substrate 10. As is shown in FIG. 2A, first, the separation layer 20 is formed on the substrate 10, and then a film structure 30 consisting of a single or plural layers necessary for forming a predetermined semiconductor circuit is formed on the separation layer 20.

After the formation of the predetermined semiconductor circuit, another substrate 40 is adhered to the film structure 30 by an appropriate adhesive. Different from the substrate 10, the substrate 40 does not require stability at a high temperature. Accordingly, the substrate 40 can be made of a cheap organic material such as plastic.

Referring to FIG. 2C, the separation layer 20 is removed by e.g. etching, thereby to separate, from the substrate 10, the film structure 30 consisting of a single or plural layers. Thus, the step of transferring the film structure to the substrate 40 is completed.

Figure 3A:
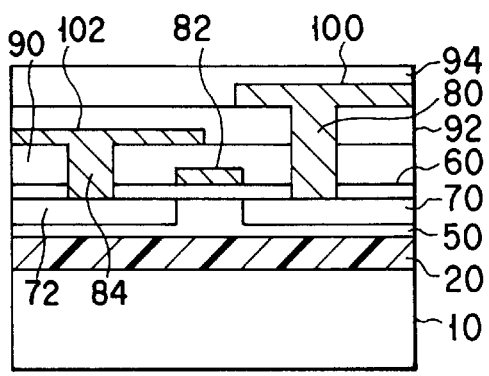
FIGS. 3A–3C are views, showing a case where a metal oxide semiconductor (MOS) field effect transistor (FET) is transferred to another substrate.
Figure 3B:
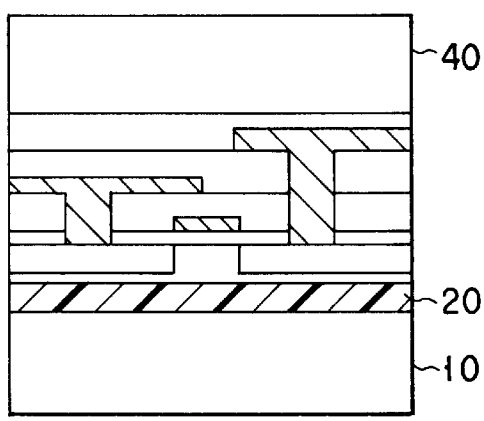
Figure 3C:
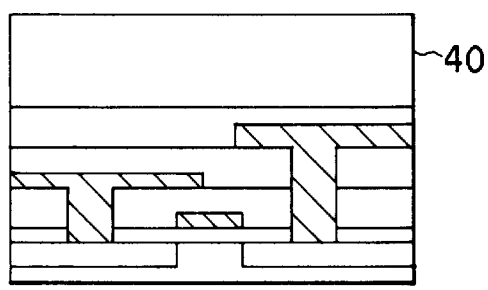

FIGS. 3A–3C are views, useful in explaining a specific example of transfer, in which a transistor element and an integrated circuit using the transistor element are transferred. More specifically, these figures show an example of transfer, in which a metal oxide semiconductor (MOS) field effect transistor (FET) is transferred.

First, a separation layer 20 is formed on a substrate 10. In the next MOSFET forming step, a crystalline silicon film 50 is formed. A gate insulating film 60 is formed on the film 50. Thereafter, a mask with a predetermined pattern is formed, thereby forming source and drain regions 70 and 72, which consist of doped silicon layers, by ion implant, diffusion, etc. Then, interlayer insulating films 90 and 92 are formed, and contact holes are formed therein, thereby forming source, gate and drain electrodes 80, 82 and 84. Further, an oxide film 94 is provided for passivation. Preferably, the crystalline silicon film 50 has a thickness of 1000–5000 nm. The electrode metal has a thickness of 10–2000 nm, and desirably of 100–1000 nm. If necessary, metal wires 100 and 102 can be provided which connect transistors incorporated in the integrated circuit or connect the integrated circuit to an external circuit. FIG. 3A schematically shows that cross section of the substrate, which is obtained after the separation layer 20 and the crystalline silicon film 50 are formed on the substrate 10, thereby finishing the step of forming a MOSFET, wiring therein, etc.

High temperature treatments of 1000° C. are used to form the crystalline silicon film 50 for forming a MOSFET, to form a gate insulating film, and to activate an impurity for forming a doped silicon region. These high temperature treatments can be performed by forming the substrate 10 of a material, such as quartz, which can stand 1000° C. or more.

Furthermore, in the above-described MOSFET manufacturing process, the properties of the crystalline silicon layer 50 can be improved using laser crystallization, laser activation, etc., and the time required for the manufacture of the MOSFET can be reduced, as compared with the high temperature treatment, using a technique for performing a treatment at a relatively low temperature, such as plasma CVD.

Then, as shown in FIG. 3B, the substrate 40 is adhered to the structure in which the transistor circuit is formed. After that, the separation layer 20 is removed and the transistor circuit is transferred to the substrate 40, as is shown in FIG. 3C.

The substrate 40 is used only to support the transistor circuit formed in the above step, and hence it is not necessary to consider the influence on it of the high temperature treatment performed during the manufacture of the transistor circuit. Accordingly, although a technique using a high treatment temperature is employed to manufacture the transistor, the substrate 40 may be formed of a cheap material with a low heat resistance, e.g. a plastic material such as an epoxy resin, polyimide, polycarbonate, etc.

The process of the invention enables the formation of a semiconductor element with excellent properties and its circuit, on a substrate formed of a cheap material with a relatively low heat resistance. The element and its circuit are produced by a high temperature process.

Figure 4A:
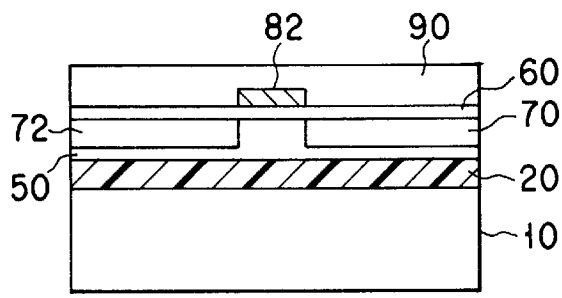
FIGS. 4A–4C are views, useful in explaining process steps of forming a gate electrode, an insulating film, a silicon film, a doped layer and an interlayer insulating film, then performing a transfer according to the invention, and forming metal wires to provide a semiconductor device circuit.
Figure 4B:
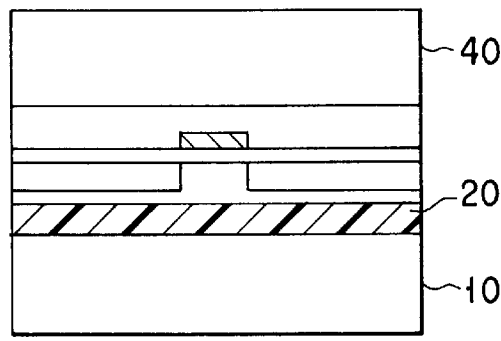
Figure 4C:
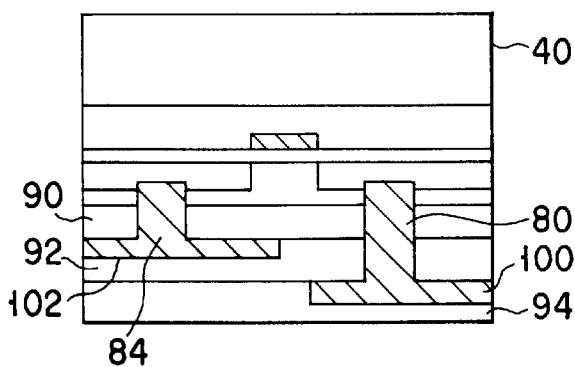

FIGS. 4A–4C show another embodiment. After a separation layer 20 and a silicon layer 50 are formed on a substrate 10, a gate insulating film 60, doped layers 70 and 72, a gate electrode 82 and an insulating film 90 are formed as shown in FIG. 4A. Subsequently, another substrate 40 is adhered to the film structure as shown in FIG. 4B, thereby performing the transfer of the invention. After that, a necessary insulating film and metal wires 80, 84, 100 and 102 may be formed as shown in FIG. 4C. In this case, the side walls of contact holes for connection to electrodes are insulated, if necessary. Also in the case of using an element other than the MOSFET, the transfer process of the invention can be used.

Figure 5A:
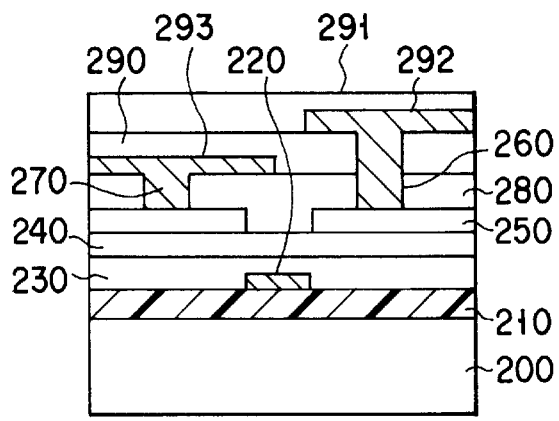
FIGS. 5A–5C are views, useful in explaining a manner of forming an amorphous silicon TFT circuit and transferring the circuit.
Figure 5B:
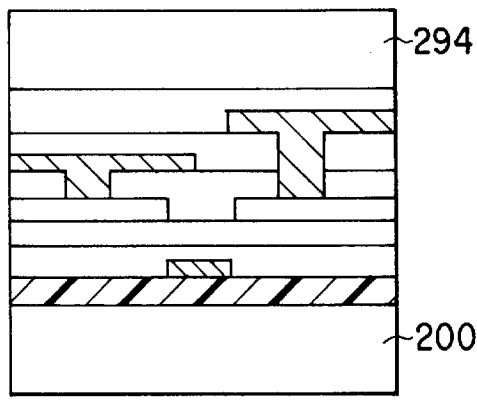
Figure 5C:
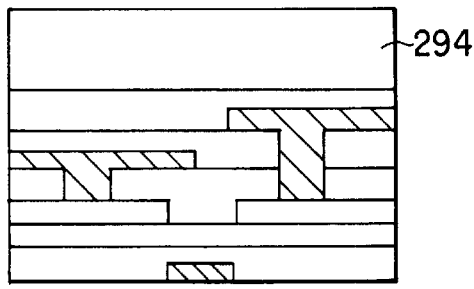

FIGS. 5A–5C show an embodiment in which an amorphous silicon TFT circuit is produced and transferred. A metal layer is formed by, for example, sputtering on a separation layer 210 provided on a substrate 200, and is patterned into a gate electrode 220 by, for example, etching. The metal electrode has a thickness of 10–2000 nm, and more preferably, 100–1000 nm. Subsequently, a silicon nitride film 230 and an amorphous silicon film 240 which serve as gate insulating films are formed by e.g. plasma CVD. The silicon nitride film has a thickness of 50–2000 nm, and more preferably, 100–1000 nm. The amorphous silicon film has a thickness of 10–1000 nm, and more preferably, 20–500 nm. After the formation of the amorphous silicon film 240, an impurity-doped amorphous silicon film 250 with a thickness of 50–200 nm is formed by e.g. plasma CVD. After that, that portion of the impurity-doped layer which corresponds to a channel is removed by etching to thereby form source and drain regions.

Thereafter, there are provided source and drain electrodes 260 and 270, interlayer insulating films 280 and 290, a passivation film 291, and metal wires 292 and 293 for connecting transistors to each other or connecting the transistors to an external circuit. FIG. 5A shows a state in which all the above-described steps are finished and the amorphous silicon TFT circuit is completed on the substrate 200.

As is shown in FIGS. 5B and 5C, the amorphous TFT and its circuit are transferred to a new substrate 294 by removing the separation layer. The support substrate 200 used to produce a film structure which includes the to-be-separated semiconductor element can be used again as the next substrate.

Figure 6A:
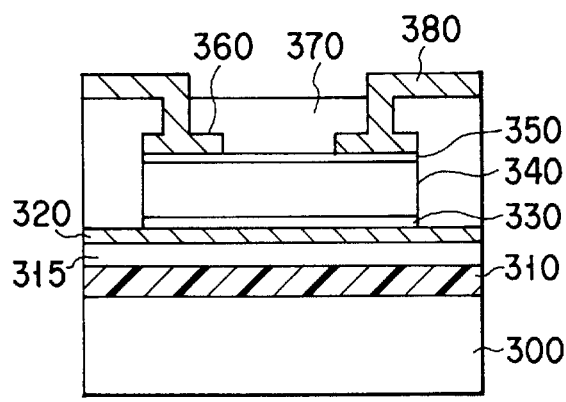
FIGS. 6A–6C are views, useful in explaining a manner of forming a solar battery element and transferring the element.
Figure 6B:
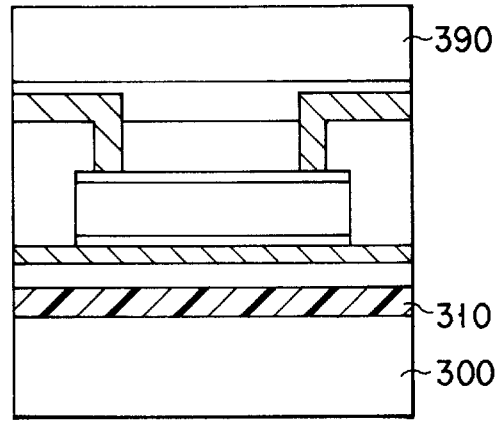
Figure 6C:
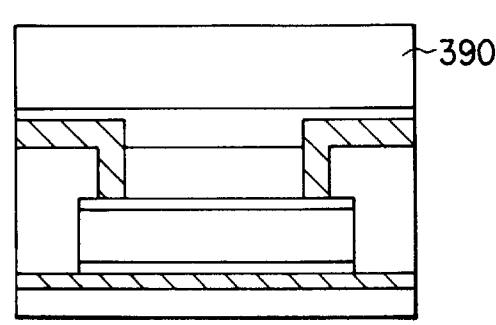

FIGS. 6A–6C show another embodiment in which a solar battery element is formed. In this case, a solar battery element is formed on a separation layer 310 provided on a substrate 300. To form an amorphous silicon solar battery, a lower electrode 320 is formed by e.g. sputtering, with an appropriate electrode protect layer 315 provided on the separation layer 310, and then a semiconductor p-type impurity layer 330 with a high concentration, a non-doped semiconductor layer 340 and a semiconductor n-type impurity layer 350 are formed in this order by e.g. plasma CVD. It is preferable that the p-type highly concentrated impurity layer, the non-doped semiconductor layer and the n-type impurity layer have thicknesses of 10–1000 nm, 100–5000 nm and 10–100 nm, respectively.

After that, an upper electrode 360 is formed, and a light receiving region is defined by removing, by e.g. etching, an outside area of the semiconductor layer of the solar battery element. Moreover, a passivation layer 370 and metal wires 380 to be connected to an external circuit or other circuit elements (not shown) are formed to thereby constitute a circuit. Thus, an amorphous silicon solar battery element is provided.

On the other hand, when a crystalline silicon solar battery is formed by the process of the invention, a three-layer structure solar battery is provided using, for example, a p-type highly concentrated impurity layer, a p-type semiconductor layer and an n-type impurity layer in place of the amorphous layers 330, 340 and 350. Each semiconductor film is formed by e.g. plasma CVD, and then subjected to a necessary crystallization treatment. The p-type highly concentrated impurity layer is formed by solid phase crystallization or fusion hardening of a doped semiconductor film. Impurity thermal diffusion is also applicable to increase the impurity concentration. The p-type semiconductor layer is formed by solid phase crystallization or fusion hardening of a semiconductor film. The n-type impurity layer is formed by implanting ions into a semiconductor film or thermally diffusing impurity in the film. It is preferable that the p-type highly concentrated impurity layer, the p-type semiconductor layer and the n-type impurity layer have thicknesses of 10–100 nm, 1000–50000 nm and 10–100 nm, respectively.

The solar battery and its circuit are adhered to a new substrate 390 as shown in FIG. 6B, and then transferred thereto by removing the separation layer as shown in FIG. 6C.

Since the structure of the element and its circuit transferred to a new substrate is inverted with respect to the original one, the original one must be designed in consideration of the inverted one. For example, if in the case of transferring the MOSFET shown in FIGS. 3A–3C, a top-gate TFT is formed first, it becomes a bottom-gate TFT after the transfer. In light of this, if a top-gate TFT is necessary after the transfer, a bottom gate TFT as shown in FIGS. 5A–5C is first manufactured and then transferred.

Figure 7:
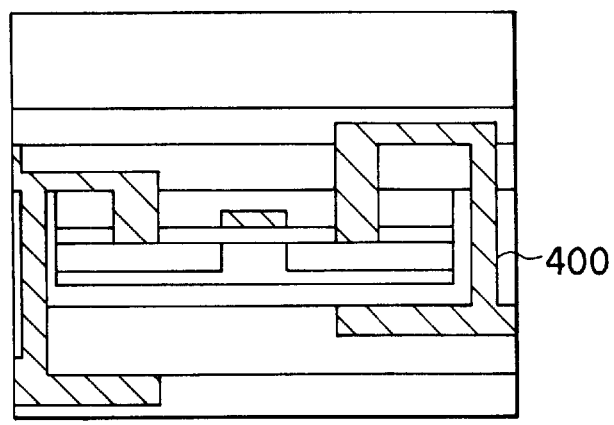
FIG. 7 is a view, showing a manner of forming wiring between TFTs after the transfer.

To connect TFTs after the transfer, a contact portion 400 for wiring is provided as shown in FIG. 7, thereby forming first a contact hole and then the wiring.

Figure 8:
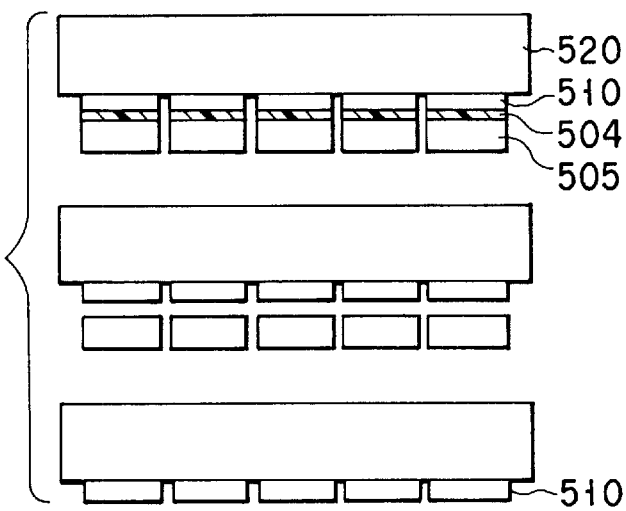
FIG. 8 is a view, useful in explaining a manner of transferring a transistor circuit formed on a small substrate onto a larger substrate.

Another embodiment of the invention is illustrated in FIG. 8. A film structure 510 which includes a semiconductor layer provided with a transistor circuit is formed on a substrate 505 beforehand, with a separation layer 504 interposed therebetween. The film structure 510 is transferred to a larger substrate 520.

This process enables elimination of the conventional difficulty in very fine patterning on a large substrate. As a result, a fine semiconductor element with excellent properties and its circuit can be formed on a very large substrate 520.

Figure 9:
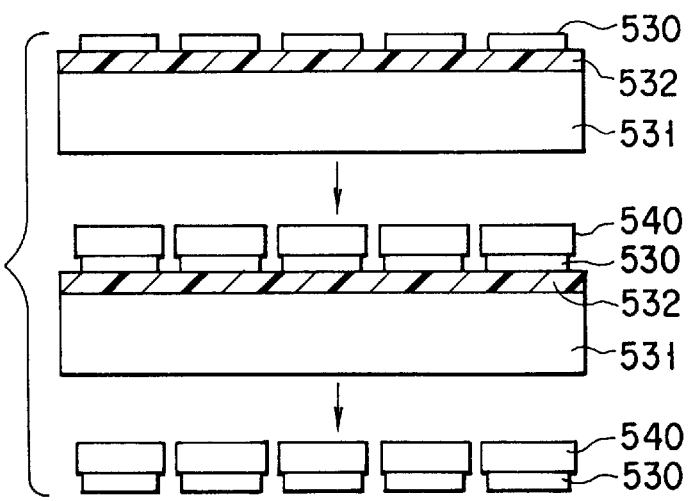
FIG. 9 is a view, useful in explaining a manner of transferring a transistor circuit formed on a large substrate onto a smaller substrate.

Further, as is shown in FIG. 9, the invention enables simultaneous formation of fine semiconductor elements or circuits with excellent properties on multiple fine substrates 540 by transferring, to the fine substrates 540, layers 530 including transistor circuits and formed on a substrate 531 with a separation layer 532 interposed therebetween.

The semiconductor element forming process of the invention is not limited to the embodiments illustrated in FIGS. 1A–9, but may be modified without departing from the technical scope of the invention.

Although in the embodiment shown in FIGS. 3A–3C, for example, the semiconductor element and its circuit are specifically a MOSFET and its circuit, the semiconductor can be an amorphous silicon TFT shown in FIGS. 5A–5C, a solar battery element shown in FIGS. 6A–6C, a bipolar element, an amorphous image sensor, etc.

Although in the embodiments illustrated in FIGS. 3A–7, transfer is performed after the completion of at least the transistor element, it can be performed even during the manufacture of the element.

FIG. 1 illustrates a removal process using etching, as a process for removing the separation layer. In this case, a film structure 30 consisting of a single layer or plural layers is separated from a substrate 10 by decomposing the separation layer using a solution or a gas for dissolving the separation layer.

Figure 10A:
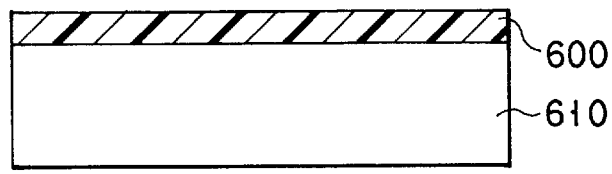
FIGS. 10A–10F are views, useful in explaining a manner of forming a separation layer with gaps defined therein.

FIGS. 10A–10F illustrate a process of forming a separation layer with air gaps 635 using a lithography technique. As shown in FIG. 10A, first, a film 600 constituting the separation layer is formed on a substrate 610. The film 600 is formed of chrome in this embodiment, but is not limited to it. It may be made of any other material suitable for carrying out the invention, i.e. a metallic material such as nickel, tantalum, tungsten, etc., of an insulating material such as alumina, silicon nitride, silicon dioxide, etc. or of InZnO. The separation layer 600 may be formed by CVD, sputtering, or any other optimal method.

Figure 10B:
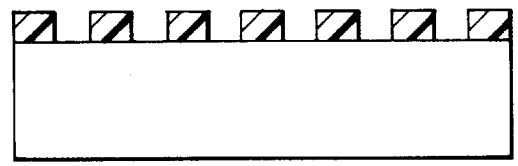
Figure 10C:
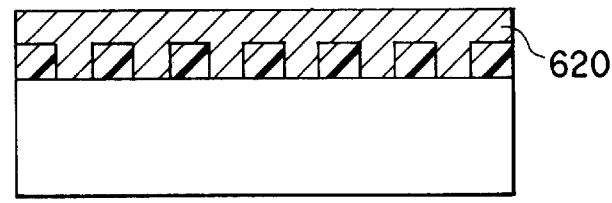
Figure 10D:
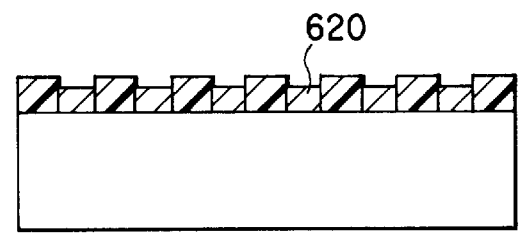

Next, portions of the film 600 are removed by lithography or etching as shown in FIG. 10B. Then, the resultant structure is coated with a material 620 which is highly soluble in an organic solvent such as a high polymer material, as is shown in FIGS. 10C and 10D. The material 620 is removed and flattened from its surface by dry etching or polishing until the film 600 is exposed.

Figure 10E:
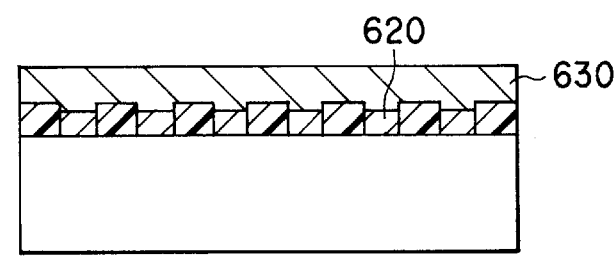

Thereafter, as shown in FIG. 10E, a film 630 for protecting the flattened surface is formed by a treatment of a low temperature such as ECR plasma CVD, sputtering, etc. The film 630 is formed of silicon oxide in this embodiment, but is not limited to it. It may be made of any other material suitable for carrying out the invention.

Figure 10F:
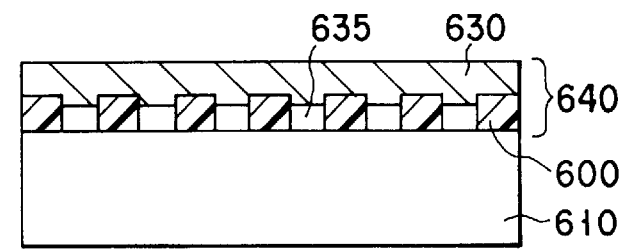
Figure 11:
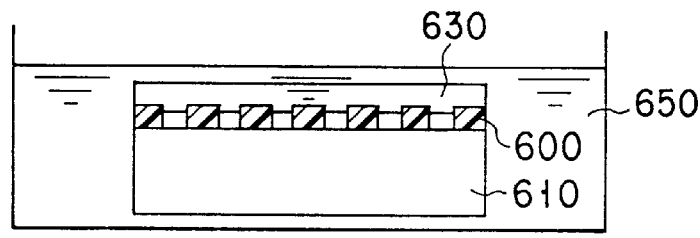
FIG. 11 is a view, illustrating a manner of removing an organic material using a solvent.

After the formation of the film 630, the material 620 is removed using a solvent, thereby forming a separation layer structure 640 with air gaps 635 as shown in FIG. 10F. To remove the material 620 using the solvent, to soak the sample in a solvent solution 650 is an easy method. The material 620 can be removed more effectively by heating the solvent solution to enhance its solvency power, or by evaporating the solvent into a highly reactive vapor.

To remove the separation layer 600, an etching solvent which can dissolve the layer 600 but not the film 630 is used.

Since the separation layer 600 has the air gaps, the etching solvent can easily enter the layer 600 to remove it.

Figure 12:
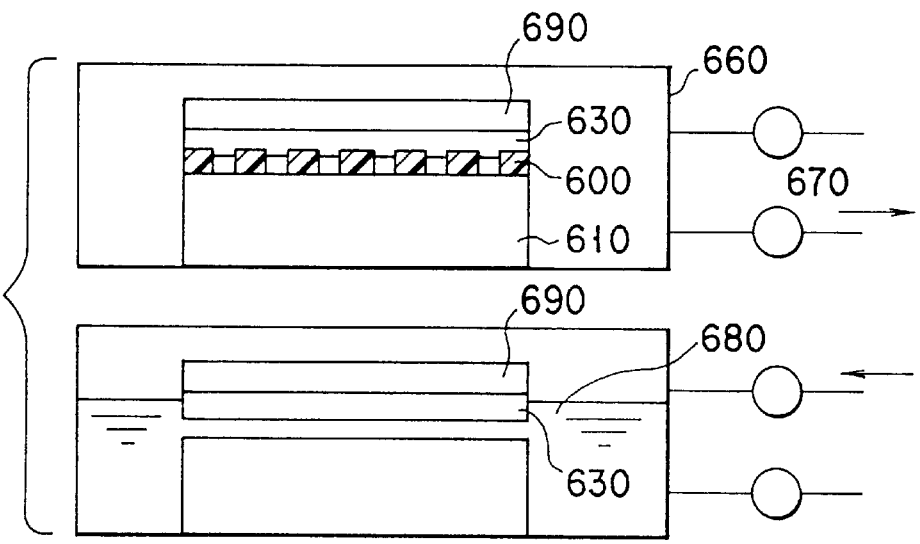
FIG. 12 is a view, illustrating a manner of introducing a sample into a vacuum container, exhausting air gaps formed in the sample using a vacuum force, and etching the resultant sample by an etching solvent.
Figure 13:
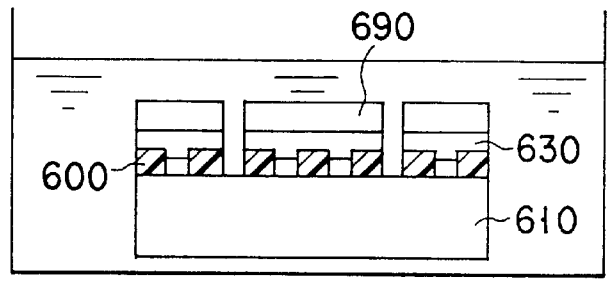
FIG. 13 is a view, illustrating a manner of removing part of a film structure provided on a separation layer with air gaps, and then removing the separation layer.

To cause the etching solution to effectively enter the separation layer so as to separate a film structure 690, the sample is contained in a vacuum container 660, then air in the air gaps of the separation layer is exhausted by vacuum exhaustion 670, and an etching solvent 680 is introduced into the container 650, as is illustrated in FIG. 12. Since the pressure in the air gaps is reduced, the etching solvent quickly enters the air gaps, dissolves the separation layer 600, and separates, from the substrate 610, the film structure consisting of a single layer or plural layers.

To more effectively remove the separation layer, the film structure 690 with the air gaps on the separation layer may be partially removed so that no semiconductor element or circuit will be influenced by the removal, thereby accelerating the function of the etching solvent for removing the separation layer.

A technique for forming a film with air gaps using sputtering is known from, for example, J. Electrochem. Soc., 131(1984), pp. 2105–2109 written by T. Serikawa and T. Yachi. According to this publication, an $SiO_2$ film with air gaps can be formed by sputtering in the atmosphere of Ar gas. Since this film can be etched at a very high speed, it can be used as the separation layer employed in the invention.

Moreover, plasma chemical phase reaction or evaporation reaction enables formation of a film with air gaps 635 by applying high gas pressure to at least portions of a film during its formation to enhance chemical phase reaction and contain fine particles in the film. The resultant film can be etched at a very high speed and hence be used as the separation layer of the invention.

The process of forming a semiconductor element according to the invention can produce, in a simple manner, a device of a large area which includes semiconductor elements of excellent properties and their circuits. In addition, the process enables formation of a semiconductor element of excellent properties and its circuit on a substrate made of a material with a low heat resistance, such as glass, plastic, etc.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a circuit device, comprising the steps of:

growing a separation layer on a support substrate having a flat surface, in a gas atmosphere or a vacuum;

removing a predetermined part of the separation layer by lithography and etching until the flat surface of the support substrate is exposed;

growing a film structure comprising one of a single layer and a plurality of layers, above the separation layer and above the predetermined part of the separation layer that has been removed;

forming a circuit device in the film structure grown on the support substrate; and separating the film structure incorporating the circuit device from the support substrate by removing the separation layer.

2. A method according to claim 1, wherein forming the separation layer comprises forming a layer made of a material selected from a group of chrome, nickel, tantalum, tungsten, alumina, silicon nitride and InZnO.

3. A method according to claim 1, wherein the step of forming the circuit device includes a step of forming a transistor in at least part of the film structure.

4. A method according to claim 1, wherein the step of forming the circuit device includes a step of forming a solar battery element in at least part of the film structure.

5. A method according to claim 1, wherein forming the separation layer comprises forming a 1000 to 10000 nm thick separation layer.

6. A method according to claim 1, wherein the step of separating the film structure from the support substrate includes a step of removing the separation layer by etching.

7. A method according to claim 1, wherein forming the separation layer comprises forming a separation layer on a single support substrate.

8. A method according to claim 1, further comprising, following the step of removing a predetermined part of the separation layer, the steps of:

coating a whole surface of the support substrate including the separation layer, with a soluble material that is soluble in an organic solvent;

surface removing a portion of the soluble material so as to expose the separation layer, thereby forming a flat soluble material surface;

forming a protective film on said flat soluble material surface; and removing a remaining portion of the soluble material with a solvent.

* * * * *

UNITED STATES PATENT AND TRADEMARK OFFICE
CERTIFICATE OF CORRECTION

PATENT NO.     : 6,339,010 B2
DATED          : January 15, 2002
INVENTOR(S)    : Sameshima It is certified that error appears in the above-identified patent and that said Letters Patent is hereby corrected as shown below:

<u>Title page,</u>
Item [45], the Date of Patent should read:
-- [45]   Date of Patent  *Jan. 15, 2002 --

The Notice information should read:
-- [*] Notice:   This patent issued on a continued prosecution application filed under 37 CFR 1.53(d), and is subject to the twenty year patent term provisions of 35 U.S.C. 154(a)(2).
Subject to any disclaimer, the term of this patent is extended or adjusted under 35 U.S.C. 154(b) by 0 days. --

Signed and Sealed this

Twenty-fourth Day of September, 2002

*Attest:*

JAMES E. ROGAN
*Attesting Officer*          *Director of the United States Patent and Trademark Office*